United States Patent
Na

(10) Patent No.: US 7,135,412 B2
(45) Date of Patent: Nov. 14, 2006

(54) METHOD TO CONTROL A MANAGEMENT SYSTEM TO CONTROL SEMICONDUCTOR MANUFACTURING EQUIPMENT

(75) Inventor: Min-Jae Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 195 days.

(21) Appl. No.: 11/006,543

(22) Filed: Dec. 8, 2004

(65) Prior Publication Data

US 2005/0214955 A1    Sep. 29, 2005

(30) Foreign Application Priority Data

Dec. 8, 2003   (KR) .................. 10-2003-0088480

(51) Int. Cl.
*H01L 21/302* (2006.01)
(52) U.S. Cl. .............. 438/714; 438/5; 438/10; 438/11; 438/17; 438/18; 216/61; 216/71
(58) Field of Classification Search .......... 216/61, 216/71; 438/5, 10, 11, 17, 18, 714
See application file for complete search history.

(56) References Cited

U.S. PATENT DOCUMENTS

| 5,569,356 | A  * | 10/1996 | Lenz et al. ............... 438/729 |
| 6,197,699 | B1 * | 3/2001  | Fritzinger et al. ......... 438/710 |
| 6,939,476 | B1 * | 9/2005  | Griffin .................... 216/59  |
| 6,983,191 | B1 * | 1/2006  | Mikata ..................... 700/121 |

* cited by examiner

*Primary Examiner*—George A. Goudreau
(74) *Attorney, Agent, or Firm*—Volentine Francos & Whitt, PLLC

(57) ABSTRACT

In the control method in a management system of semiconductor manufacturing equipment to enhance a product yield through a control of etching process, information of a corresponding lot for the etching process is recognized. It is checked whether the information of corresponding lot is for an etching process after a predetermined RF time of etching apparatus. RF time of the etching apparatus is compared with the predetermined RF time, and it is decided whether the etching process of corresponding lot can be performed in the etching apparatus if the etching process for the corresponding lot should be performed after a lapse of the predetermined RF time.

12 Claims, 4 Drawing Sheets

METHOD TO CONTROL A MANAGEMENT SYSTEM TO CONTROL SEMICONDUCTOR MANUFACTURING EQUIPMENT

BACKGROUND OF THE INVENTION

1. Field of the Invention

The present invention generally relate to a method to control a management system to control semiconductor manufacturing equipment.

A claim of priority is made to Korean Patent Application 2003-88480, filed on Dec. 8, 2003, the contents of which are incorporated by reference.

2. Description of the Related Art

The semiconductor technology field has remarkably grown in recent years by the rapid development in the information technology area and the popularization of information media such as the computer. Semiconductor devices require faster speed operations and larger storage capabilities. Continue research and development in the manufacturing of semiconductor devices having higher integration, reliability, response speed, and better automation, is required.

Semiconductor device manufacturing techniques generally include a deposition process to form a process layer on a semiconductor substrate, and a photolithography process to form and pattern a photoresist layer on the process layer.

Typically the photolithography process is divided into a photo process, an etching process, and a cleaning process. In the photo process, a photoresist layer is formed on a semiconductor substrate, and then a photoresist layer is patterned. In the etching process, the process layer exposed by the patterned photoresist layer is selectively removed. In the cleaning process, the photoresist layer and by-products generated from the etching process are removed by a cleaning solution, so as to leave only the non-etched portion of the process layer. The etching process may be performed by a wet etch or dry etch. Recent etching processes for the use in micro patterns, requiring submicron design rules, are mainly performed by the dry etch process.

In the dry etching apparatus, a high voltage Radio Frequency (RF) signal is applied to an etch reaction gas and inactive gas within a process chamber to create a plasma state. The plasma reaction gas removes the process layer exposed by the photoresist layer. Herewith, polymer components, which are etching by-products and which contaminate the process chamber, must be removed from the process chamber. Preventive maintenance procedure on the process chamber such as cleaning process should be periodically performed. For example, if the RF time is assumed to be roughly the total use time of the chamber after it has been cleaned, then maintenance procedure should be performed on the process chamber, for example, after every about 100 RF use hours. The etching rates of the etching apparatus may be affected by the RF time.

When etching an insulation layer to form a contact hole between a plurality of stack gates, a cassette having 25 wafers is loaded in a port, and then the wafers are sequentially etched. Afterwards, the cassette is unloaded and cleaned, and then the wafers are transferred to the next position for further process.

The management system is composed of a plurality of semiconductor manufacturing equipment, an equipment server connected on-line to each semiconductor manufacturing equipment to directly control the semiconductor manufacturing equipments, a host computer that is connected on-line to the equipment server stores a database of data necessary for controlling the semiconductor manufacturing equipment, and an operator interface that is connected on-line to the host computer to allow an operator to check the progress of the manufacturing process and related operational data. When a lot i.e., (batch) of wafers is loaded into a semiconductor manufacturing equipment, the operator inputs through the operator interface, process data, e.g., equipment lot identification and equipment identification numbers.

When the data is inputted to the host computer, the host computer downloads the process condition recipe to the semiconductor manufacturing equipment.

After a predetermined time, certain components of the semiconductor manufacturing equipment are exchanged and cleaned to conduct preventive maintenance. In addition, some of the variables in the host computer's process recipe data are updated or replaced. The update or replacement of the data may also take place when different semiconductor device products are manufactured.

Thus, the control system of the prior art only calculates and displays use accumulation time and the RF time after the preventive maintenance. Therefore, the prior art has the following problems.

A host computer cannot control the etching apparatus according to the RF time of etching apparatus.

Furthermore, productivity may decrease because recipe (production data) based on the RF time may vary depending on the operator (operator specific).

SUMMARY OF THE INVENTION

The present invention discloses a method to control a management system by loading a batch of wafers in an etching apparatus by loading a batch of wafers in an etching apparatus, determining whether the batch of wafers has a Radio Frequency (RF) time limit requirement, and checking an RF time of the etching apparatus if the RF time of the batch of wafers has the RF time limit requirement, and executing an etching process on the batch of wafers if the RF time of the etching apparatus exceeds a predetermined RF time.

The present invention also discloses another method to control a management system by determining whether the batch of wafers has a Radio Frequency (RF) time limit requirement, checking an RF time of a plurality of etching apparatuses if the RF time of the batch of wafers has the RF time limit requirement, loading the batch of wafers into an etching apparatus, if one of the plurality of etching apparatuses has exceeded a predetermined RF time, and executing an etching process on the batch of wafers.

DETAILED DESCRIPTION

Hereinafter, example embodiments of the present invention will be described in detail with reference to FIGS. 1 to 4. It will be understood by those skilled in the art that the present invention can be embodied in numerous different ways and is not limited to the following described example embodiments.

Figure 1:
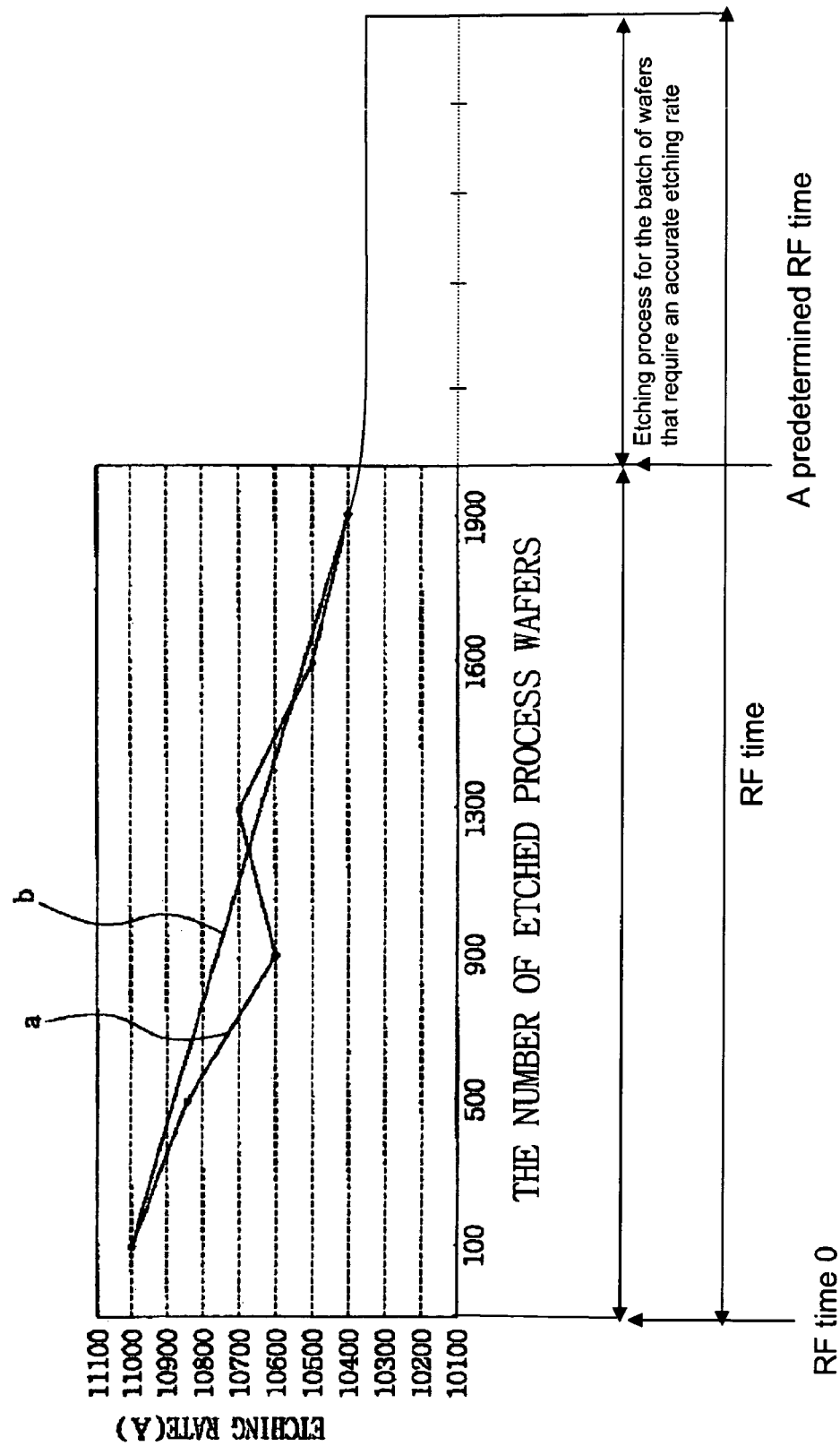
FIG. 1 is a graph illustrating the change in etch rate based on the number of wafers for an etching process.

FIG. 1 is a graph illustrating the change in etching rate versus the number of etched wafers during an etching process. In FIG. 1, an actual measured line (a) shows data obtained by monitoring the actual etching process in an etching apparatus, and a trend line (b) is linear interpolation of the data. Herewith, a reduction in the etching rate based on the number of the etched wafers is shown. The transverse axis of the graph designates the number of wafers etched by the etching process, and the longitudinal axis designates the etching rate (Å) of wafers or thin films formed on the wafers in a predetermined unit time. As shown in the actual measured line (a) and the trend line (b) in FIG. 1, when the number of etched wafers in the etching process increases, the etching rate does continuously fall based on the number of etched wafers. The etching rate may be affected by different equipment models or etching methods.

In the case where the etching rate falls, it is easy to control the etching operation based on the thickness of the process layer. Furthermore, as it can be confirmed by the actual measured line (a) and the trend line (b), the etching rate linearly decreases with reference to the RF time. However, the etching rate generally remains at a consistent etching rate after a lapse of a predetermined RF time regardless of the number of etched wafers.

Since the etching rate of etching apparatus is gradually reduced with the RF time but then remains constant after a lapse of a predetermined RF time, it is preferable that wafers, which require reproducible etching rate or no margin etch target be etched after the lapse of the predetermined RF time.

Figure 2:
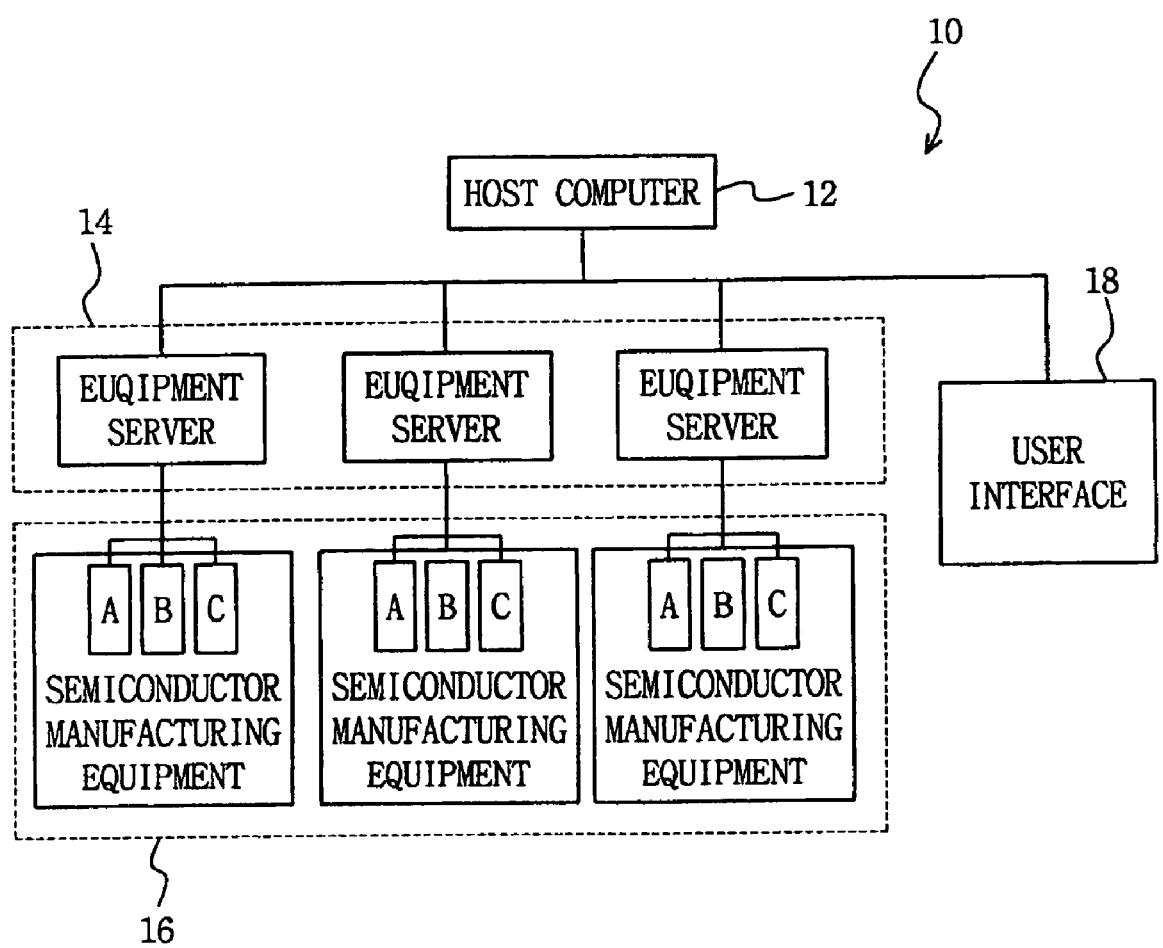
FIG. 2 is a block diagram schematically illustrating a management system for semiconductor manufacturing equipment according to the present invention.

FIG. 2 is a block diagram schematically illustrating a management system for semiconductor manufacturing equipment according to an example embodiment of the invention.

Referring to FIG. 2, a management system 10 includes a plurality of semiconductor manufacturing equipments 16, equipment servers 14, a host computer 12, and an operator interface 18.

The plurality of manufacturing equipments 16 performs various manufacturing processes.

Equipment servers 14 are connected with and directly control semiconductor manufacturing equipments 16.

Host computer 12 is connected to equipment servers 14, and contains necessary data information to control equipment servers 14 and semiconductor manufacturing equipments 16.

Operator interface 18 is also connected to host computer 12, to provide an operator or engineer control to the related data for the semiconductor manufacturing process.

The connection between host computer 12 and equipment server 14, the connection between operator interface 18 and host computer 12, and the connection between equipment server 14 and semiconductor manufacturing equipments may be connected by on-line.

Semiconductor manufacturing equipments 16 and equipment servers 14 communicate with each other by A Semi Equipment Communications Standard (SECS) protocol to share and exchange data. Equipment servers 14 and Host computer 12 communicate with each other by A Transmission Control Protocol/Internet Protocol (TCP/IP) to exchange data.

The data necessary to perform the processes under an optimum arrangement of semiconductor manufacturing equipments 16 disposed on a semiconductor production line are stored in host computer 12. For example, the data includes the process sequence of respective semiconductor manufacturing equipments, the process environment, and the process condition recipe. After the preventive maintenance procedure of the etching apparatus is carried out, the data further contains use accumulation time such as the RF time.

Therefore, the management system for semiconductor manufacturing equipment according to the present invention can calculate the RF time and convert it to data, after performing preventive maintenance on the etching apparatus.

A method to control the management system in semiconductor manufacturing equipment of the present invention will now be described.

Figure 3:
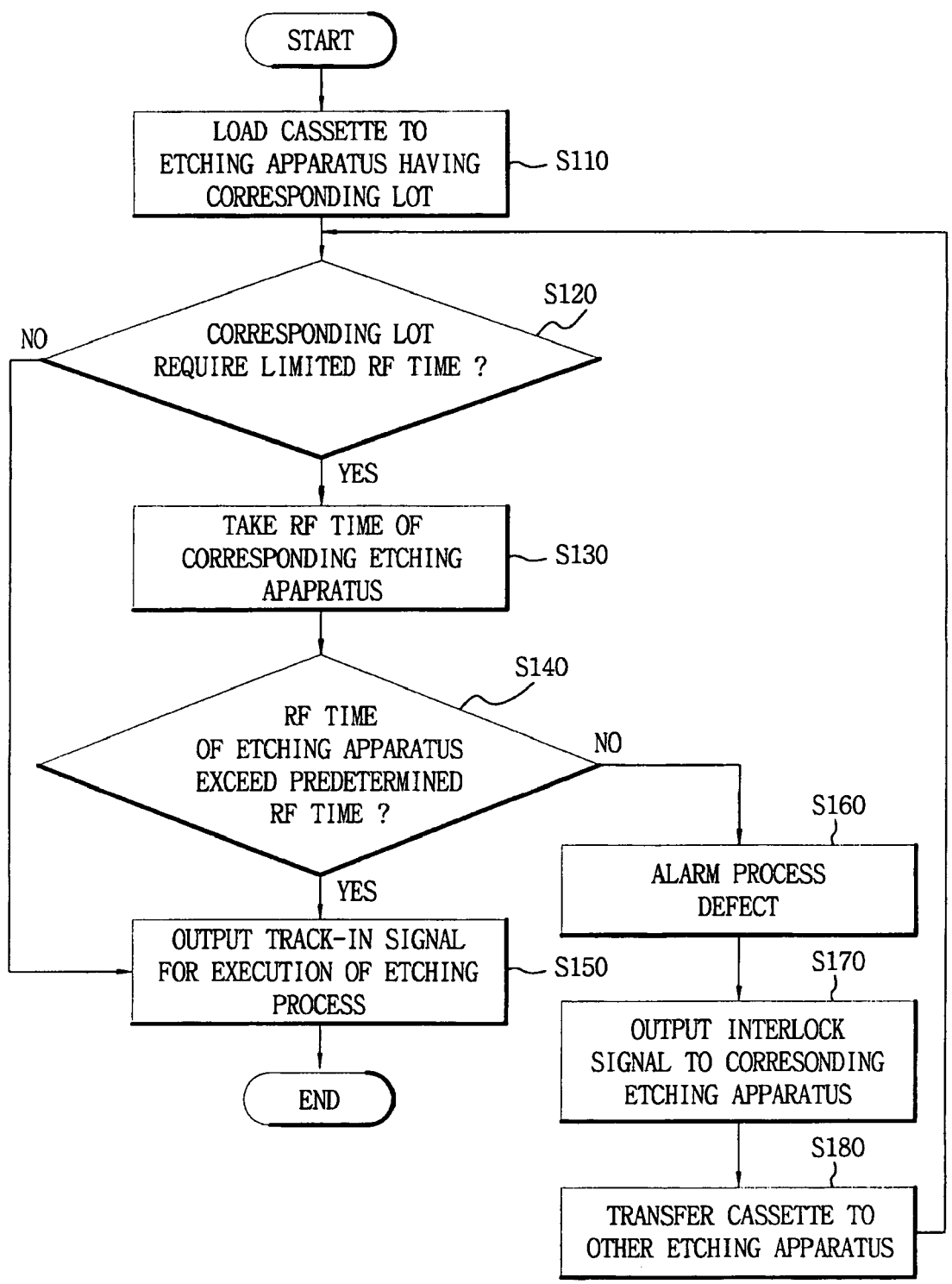
FIG. 3 is a flowchart illustrating a method to control a management system for semiconductor manufacturing equipment according to an embodiment of the present invention.

FIG. 3 is a flowchart illustrating the control method according to an embodiment of the invention.

As shown in FIG. 3, in step S110 a cassette having wafers loaded therein is selected and loaded to any one of the etching apparatuses for an etching process. The wafers have completed a photo process or some other preliminary manufacturing process. Before the cassette is loaded onto the etching apparatus, an operator transmits via an operator interface 18 the data protocol between a host computer 12 and semiconductor manufacturing equipments 16. The data protocol is SECS message, e.g., S1S31, S1F32 . . . The S1S31 contains message for the first etching process, e.g., MID='mid1', PPID='Aproc'. The S1F32 contains message for a second process, e.g., MID='mid1', PPID='Bproc', etc. Herewith, MID is the lot identification of the wafers in the cassette so that the equipment can recognize the cassette's recipe lot name. PPID is recognized by the equipment to perform a certain process on the wafers, i.e., a recipe process name for the etching process.

Step S120 determines whether wafers in the cassette require a minimum RF time, or the etching of the wafers generates polymers. That is, the PPID of the corresponding lot (batch), i.e., wafers to be processed, determines whether process defects may be generated, i.e., etching amount is related to the RF time, or polymers are generated. If the wafers are not limited by the RF time, in step S150 host computer 12 outputs a "track in" signal and the etching process is carried out. When the RF time is not limited, the etching apparatus is suitable to be used for an etching process.

If polymer is generated, in step S130 a host computer 12 takes RF time data of the etching apparatus from the database.

In step S140, the RF time of etching apparatus is compared with a predetermined RF time.

If the RF time of etching apparatus has reached a predetermined RF time, then the etching process can proceed. Accordingly, in step S150 the host computer 12 outputs a "track in" signal and the etching process is carried out.

However, if the RF time of etching apparatus has not exceeded the predetermined RF time, in step S160 the host computer 12 sounds an alarm or displays a warning message. Then in step S170, host computer 12 outputs an "interlock signal". In step S180, the corresponding lot (batch) is transferred to another etching apparatus, and then steps S120–S140 are repeated until an etching apparatus with a suitable RF time is found.

Meanwhile, in the case the etching apparatus is configured independently, host computer 12 can output an interlock signal for the etching apparatus to stop the etching process.

Thus, according to this embodiment of the present invention, the control method in the management system of the semiconductor manufacturing equipment can prevent etch defects based on the RF time, and increase the product yield.

Figure 4:
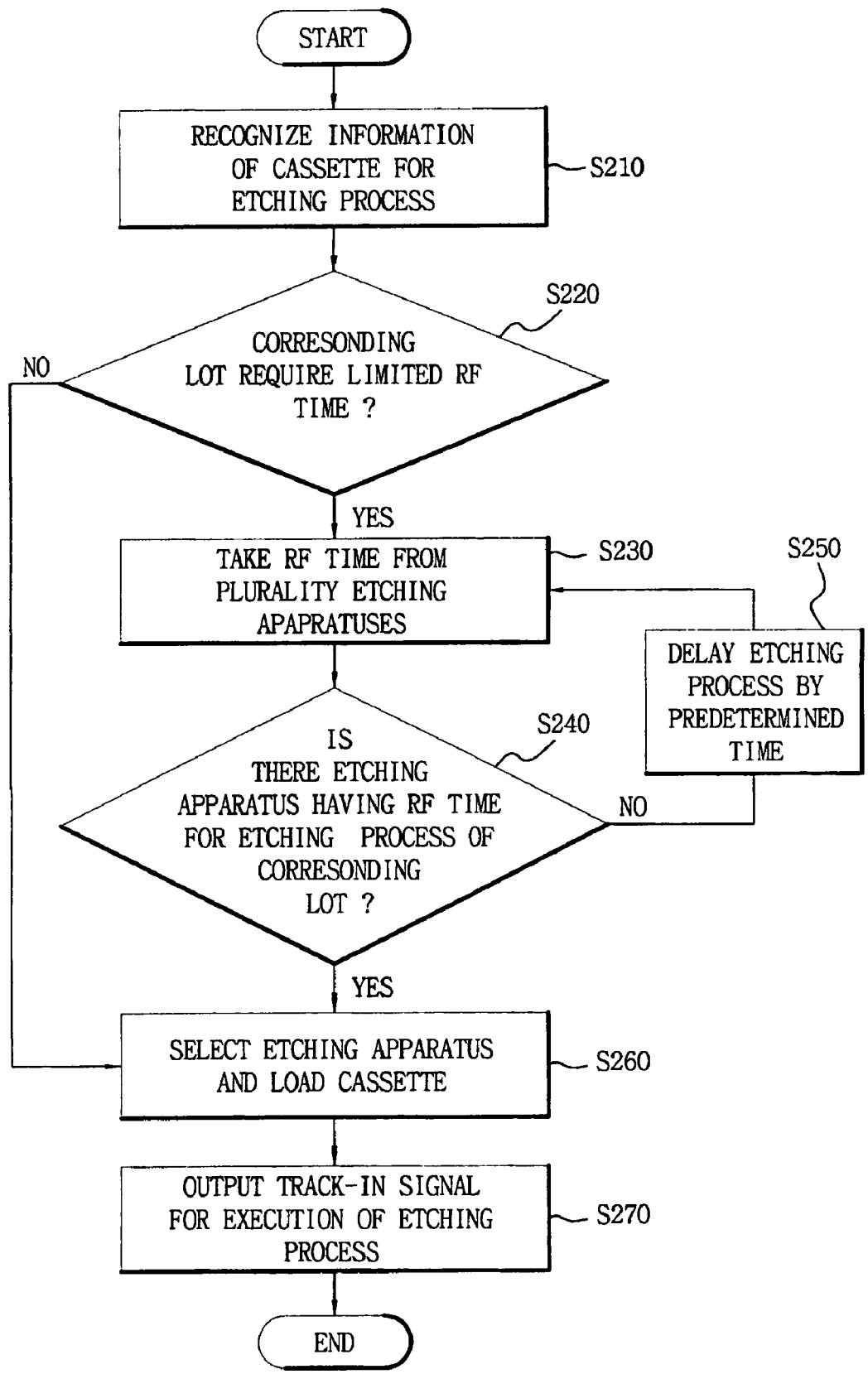
FIG. 4 is a flowchart illustrating a method to control a management system for semiconductor manufacturing equipment according to another embodiment of the present invention.

FIG. 4 is a flowchart illustrating a control method according to another embodiment of the present invention.

As shown in FIG. 4, in step S210 host computer 12 recognizes information for an etching process for a cassette. At this time, an operator transmits data to an etching apparatus through operator interface 18 to determine data for the etching process by using SECS message, e.g., S1S31, S1F32 . . . The S1S31 contains message for a first etching process, e.g., MID='mid1', PPID='Aproc'. The S1F32 contains message for a second process, e.g., MID='mid1', PPID='Bproc', etc.

In step S220, host computer 12 checks whether the etching process requires a limited RF time if the etching process does not require a limited RF time, host computer 12 selects an etching apparatus by a predetermined loading sequence or restriction, or randomly among the available etching apparatuses. Then in step S260, host computer 12 causes the cassette to load onto the loading apparatus. Also in step S270, host computer 12 outputs a track-in signal for the execution of etching process.

If the etching process requires a limited RF time, in step S230, host computer 12 checks the RF time data of the plurality of etching apparatus from the database.

In step S240, the host computer check whether there is an etching apparatus having a suitable RF time.

In step S250, if there is no etching apparatus having a suitable RF time, host computer 12 causes a delay in the etching process. At this time, if all the etching apparatuses are unavailable, the cassette is transferred to a storage such as a stacker, and stored for a predetermined time.

In step S230, host computer 12 again takes the RF time data of the etching apparatuses from the database after the predetermined delay in the etching process; and in step S240, host computer 12 determines again whether there is an etching apparatus having a suitable RF time.

If an etching apparatus is available, in step S260, host computer 12 selects the available etching apparatus in compliance with the loading sequence or predetermined restriction, or randomly selects a corresponding etching apparatus regardless of the loading sequence or predetermined restriction.

Lastly in step S270, host computer 12 outputs a track-in signal when the corresponding lot (batch) is loaded to the etching apparatus, so that the etching process can be performed.

Thus, according to this embodiment of the present invention, the control method of the present invention can prevent etch defects based on the RF time, and increase the product yield by automatically controlling the etching apparatus in conformity with the RF time.

It will be apparent to those skilled in the art that modifications and variations can be made in the present invention without deviating from the scope of the invention. Thus, it is intended that the present invention cover any such modifications and variations of this invention provided they come within the scope of the appended claims and their equivalents.

What is claimed is:

1. A method to control a management system, comprising:
   loading a batch of wafers in an etching apparatus;
   determining whether the batch of wafers has a Radio Frequency (RF) time limit requirement; and
   checking an RF time of the etching apparatus if the RF time of the batch of wafers has the RF time limit requirement, and executing an etching process on the batch of wafers if the RF time of the etching apparatus exceeds a predetermined RF time.

2. The method of claim 1, wherein if the RF time requirement for the batch of wafers is not limiting, executing an etching process on the batch of wafers.

3. The method of claim 1, wherein if the RF time of the etching apparatus has not reached a predetermined time, the host computer outputs an interlock signal, and transfers the batch of wafers to another etching equipment.

4. The method of claim 3, further comprising sounding an alarm or displaying a warning prior to outputting the interlock signal.

5. The method of claim 1, wherein if the RF time of the batch of wafers is not limiting, executing an etching process on the batch of wafers.

6. The method of claim 1, wherein a host computer checks for the RF time limit requirement for the batch of wafers.

7. The method of claim 6, wherein the RF time of the etching apparatus is stored in the host computer.

8. A method to control a management system, comprising:
   determining whether the batch of wafers has a Radio Frequency (RF) time limit requirement;
   checking an RF time of a plurality of etching apparatuses if the RF time of the batch of wafers has the RF time limit requirement,
   loading the batch of wafers into an etching apparatus, if one of the plurality of etching apparatuses has exceeded a predetermined RF time; and
   executing an etching process on the batch of wafers.

9. The method of claim 8, wherein if none of the plurality etching apparatus has exceeded a predetermined RF time, delaying the etching process on the batch of wafers for a predetermined time until at least one of the plurality of etching apparatuses exceeds a predetermined RF time.

10. The method of claim 8, wherein if the RF time of the batch of wafers is not limiting, executing an etching process on the batch of wafers.

11. The method of claim 8, wherein a host computer checks for the RF time limit requirement for the batch of wafers.

12. The method of claim 11, wherein the RF time of the etching apparatus is stored in the host computer.

* * * * *